United States Patent
Etori et al.

(10) Patent No.: US 12,032,292 B2
(45) Date of Patent: Jul. 9, 2024

(54) PHOTOSENSITIVE FILM AND METHOD FOR FORMING PERMANENT MASK RESIST

(71) Applicants: Showa Denko Materials Co., Ltd., Tokyo (JP); KIMOTO CO., LTD., Saitama (JP)

(72) Inventors: Hideki Etori, Saitama (JP); Keiko Kitamura, Saitama (JP); Yoshiaki Fuse, Tokyo (JP); Nobuhito Komuro, Tokyo (JP)

(73) Assignees: Resonac Corporation, Tokyo (JP); KIMOTO CO., LTD., Saitama (JP)

(*) Notice: Subject to any disclaimer, the term of this patent is extended or adjusted under 35 U.S.C. 154(b) by 561 days.

(21) Appl. No.: 17/055,264

(22) PCT Filed: May 9, 2019

(86) PCT No.: PCT/JP2019/018615
§ 371 (c)(1),
(2) Date: Nov. 13, 2020

(87) PCT Pub. No.: WO2019/221012
PCT Pub. Date: Nov. 21, 2019

(65) Prior Publication Data
US 2021/0124267 A1    Apr. 29, 2021

(30) Foreign Application Priority Data
May 16, 2018 (JP) ................. 2018-094573

(51) Int. Cl.
*G03F 7/11*   (2006.01)
*G03F 7/09*   (2006.01)
*G03F 7/30*   (2006.01)
*H05K 3/00*   (2006.01)

(52) U.S. Cl.
CPC ............. *G03F 7/092* (2013.01); *G03F 7/30* (2013.01); *H05K 3/0076* (2013.01)

(58) Field of Classification Search
CPC ............. G03F 7/11; G03F 7/092; G03F 7/30
See application file for complete search history.

(56) References Cited

U.S. PATENT DOCUMENTS

| 2016/0039188 A1* | 2/2016 | Namikawa | B44C 1/17 428/425.5 |
| 2017/0045817 A1* | 2/2017 | Nagoshi | G03F 7/029 |

FOREIGN PATENT DOCUMENTS

| CN | 106233205 A | 12/2016 | |
| JP | H07-333853 A | 12/1995 | |
| JP | 2010-085513 A | 4/2010 | |
| JP | 2012-027368 A | 2/2012 | |
| JP | 2015-166866 A | 9/2015 | |
| JP | 2017-191336 A | 10/2017 | |
| JP | 2022-051508 A | 3/2022 | |
| TW | 201601608 A | 1/2016 | |
| WO | 2008/093643 A1 | 8/2008 | |
| WO | WO-2015163455 A1 * | 10/2015 | ............. B32B 27/38 |

OTHER PUBLICATIONS

Unitika, "Technical Data Sheet—EMBLET type PTHA-25", No. 2548, Unitika Ltd. Films Division, Dec. 14, 2016, 1 page.
International Search Report issued in PCT/JP2019/018615; mailed Jul. 23, 2019.

* cited by examiner

*Primary Examiner* — John S Chu
(74) *Attorney, Agent, or Firm* — Studebaker & Brackett PC (57) ABSTRACT

A photosensitive film of the present invention includes a carrier film having a first surface whose surface roughness is 0.1 to 0.4 μm, and a photosensitive layer formed on the first surface, in which a haze of the carrier film is 30 to 65%, and a spectral haze at a wavelength of 405 nm of the carrier film, as measured by providing a transparent resin layer in which a difference between a refractive index of the transparent resin layer and a refractive index of the photosensitive layer is within ±0.02 on the first surface, is 0.1 to 9.0%.

8 Claims, 3 Drawing Sheets

PHOTOSENSITIVE FILM AND METHOD FOR FORMING PERMANENT MASK RESIST

TECHNICAL FIELD

The present invention relates to a photosensitive film and a method for forming a permanent mask resist.

BACKGROUND ART

Along with performance enhancement in various electronic apparatuses, high integration of semiconductors is in progress.

According to this, there is a demand that various performances are imparted to permanent mask resists which are formed on printed wiring boards, semiconductor package substrates, and the like.

In order to form a permanent mask resist, a photosensitive film in which a layer formed by a photosensitive resin composition (hereinafter, referred to as the "photosensitive layer") is formed on a support film (carrier film) has been widely used. Along with fine-lined pitch of wirings, there is a demand that a resist pattern excellent in resolution is formed on the photosensitive layer of the photosensitive film.

When a resist pattern is formed by using a photosensitive film, a photosensitive layer is laminated on a substrate, and then the photosensitive layer is exposed to light through a support film without peeling off the support film. In order to deal with such an exposure treatment, it has been proposed to use a support film having a small haze (for example, see Patent Literatures 1 to 3).

CITATION LIST

Patent Literature

Patent Literature 1: JP H07-333853 A
Patent Literature 2: WO 2008/093643 A1
Patent Literature 3: JP 2015-166866 A

SUMMARY OF INVENTION

Technical Problem

Along with high integration of semiconductors, since a material such as an underfill material is further stacked on a permanent mask resist, the permanent mask resist is required to be excellent in adhesiveness with a material to be stacked. In general, in order to improve adhesiveness between the permanent mask resist and an underfill material or the like, a surface of a resist pattern is roughened by a plasma treatment or the like. Therefore, a step of forming a permanent mask resist using a photosensitive film becomes troublesome. In this regard, not only a resist pattern excellent in resolution is required to be thrilled, but also a permanent mask resist excellent in adhesiveness is required to be formed when a step of subjecting a surface of a resist pattern to a roughening treatment is omitted.

An object of the present invention is to provide a photosensitive film in which a resist pattern excellent in resolution and adhesiveness is easily formed, and a method for forming a permanent mask resist using the photosensitive film.

Solution to Problem

An embodiment of the present invention relates to a photosensitive film including a carrier film having a first surface whose surface roughness is 0.1 to 0.4 µm, and a photosensitive layer formed on the first surface, in which a haze of the carrier film is 30 to 65%, and a spectral haze at a wavelength of 405 nm of the carrier film, as measured by providing a transparent resin layer in which a difference between a refractive index of the transparent resin layer and a refractive index of the photosensitive layer is within ±0.02 on the first surface, is 0.1 to 9.0%.

The carrier film may have a resin layer containing inorganic particles and a binder resin at a side of the first surface. The resin layer may contain inorganic particles having an average particle diameter of 0.1 to 3.0 µm.

Another embodiment of the present invention relates to a method for forming a permanent mask resist, the method including a step of stacking the above-described photosensitive film on a substrate in order of the photosensitive layer and the carrier film, a step of irradiating a predetermined portion of the photosensitive layer with active light rays via the carrier film to form a photocured part in the photosensitive layer, and a step of peeling off the carrier film and then removing a portion other than the photocured part to form a resist pattern, in which a surface roughness of the resist pattern is 0.1 to 0.4 µm.

Advantageous Effects of Invention

According to the present invention, it is possible to provide a photosensitive film in which a resist pattern excellent in resolution and adhesiveness is easily formed, and a method for forming a permanent mask resist using the photosensitive film.

DESCRIPTION OF EMBODIMENTS

Hereinafter, embodiments for carrying out the present disclosure will be specifically described with reference to the drawings as necessary. However, the present disclosure is not limited to the following embodiments. Furthermore, the term "layer" is meant to include a structure having a shape that is formed over the entire surface when observed in a plan view, as well as a structure having a shape that is formed in a portion. Furthermore, a numerical value range expressed using "to" represents a range that includes the numerical values described before and after "to" as the minimum value and the maximum value, respectively. Furthermore, in a numerical value ranges described stepwise in the present specification, the upper limit or the lower limit of a numerical value range of a certain step may be substituted by the upper limit or the lower limit of a numerical value range of another step. Furthermore, in a numerical value range described in the present specification, the upper limit or lower limit of the numerical value range may be substituted by a value disclosed in the Examples.

[Photosensitive Film]

A photosensitive film of the present embodiment includes a carrier film having a first surface whose surface roughness is 0.1 to 0.4 µm, and a photosensitive layer formed on the first surface, in which a haze of the carrier film is 30 to 65% and a spectral haze at a wavelength of 405 nm of the carrier film, as measured by providing a transparent resin layer in which a difference between a refractive index of the transparent resin layer and a refractive index of the photosensitive layer is within ±0.02 on the first surface, is 0.1 to 9.0%. By using such a photosensitive film, not only a resist pattern excellent in resolution can be formed, but also a permanent mask resist excellent in adhesiveness can be produced even when a step of subjecting a surface of a resist pattern to a roughening treatment is omitted.

(Carrier Film)

Figure 1:
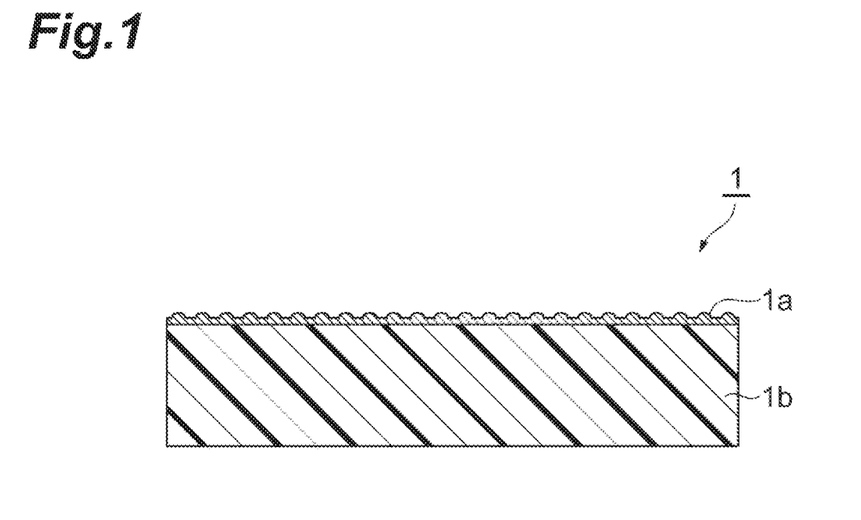
FIG. 1 is a schematic cross-sectional view illustrating a carrier film according to the present embodiment.

The carrier film according to the present embodiment has unevenness having a surface roughness of 0.1 to 0.4 nm at the side of a surface (first surface) which is in contact with the photosensitive layer. FIG. 1 is a schematic cross-sectional view for describing an example of a carrier film according to the present embodiment. As illustrated in FIG. 1, a carrier film 1 can have a base material layer 1b and a resin layer 1a formed on one surface of the base material layer 1b. The unevenness is formed on the surface of the resin layer 1a that becomes the first surface.

Figure 2:
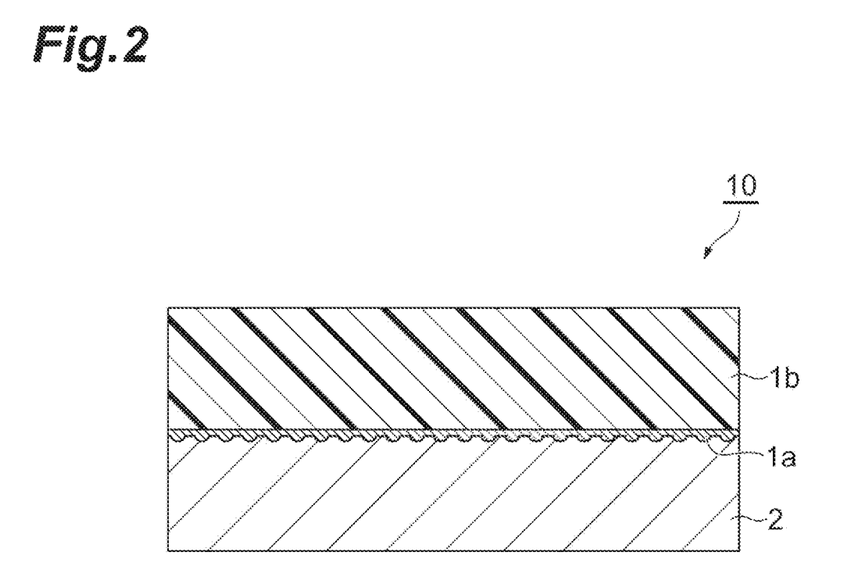
FIG. 2 is a schematic cross-sectional view illustrating a photosensitive film according to the present embodiment.

FIG. 2 is a schematic cross-sectional view for describing an example of a photosensitive film according to the present embodiment. A photosensitive film 10 illustrated in FIG. 2 includes the carrier film 1 including the base material layer 1b and the resin layer 1a and a photosensitive layer 2 provided on the resin layer 1a of the carrier film 1.

As the base material layer 1b, a polymer film having light transparency can be used. The total light transmittance of the base material layer 1b is preferably 85% or more and more preferably 90% or more. The haze of the base material layer 1b is preferably 4% or less, more preferably 2% or less, and further preferably 1% or less. Examples of such a polymer film include polyester films such as a polyethylene terephthalate film and polyolefin films such as a polyethylene film and a polypropylene film.

The thickness of the base material layer 1b is, for example, 5 to 250 μm. The thickness of the base material layer 1b is preferably 5 to 100 μm, more preferably 10 to 70 μm, further preferably 15 to 40 μm, and particularly preferably 20 to 35 μm, from the viewpoints of handleability and resolution. When the thickness of the base material layer 1b is 5 μm or more, handleability is excellent, and when the thickness thereof is 250 μm or less, a distance from a photomask to the photosensitive layer can be adjusted, and thereby a decrease in resolution due to the influence of a diffraction phenomenon is easily suppressed.

The resin layer 1a can contain inorganic particles and a binder resin. From the viewpoint of adjusting the surface roughness to a target range, the inorganic particles are contained in the resin layer 1a in an amount of preferably 1 to 20% by mass and more preferably 1 to 10% by mass. When the resin layer 1a contains inorganic particles, unevenness having a surface roughness of 0.1 to 0.4 μm is easily formed on a surface (first surface), which is in contact with the photosensitive layer, of the carrier film. Further, the shape of the unevenness is easily transferred to the surface of the photosensitive layer.

Examples of the inorganic particles include silica particles, calcium carbonate particles, alumina particles, titanium oxide particles, and barium sulfate particles. From the viewpoint of decreasing a refractive index difference between the inorganic particles and the binder resin, silica particles are preferably used as the inorganic particles. The resin layer 1a may contain inorganic particles having an average particle diameter of 0.1 to 3.0 μm. From the viewpoint of easily adjusting the surface roughness, the average particle diameter of the inorganic particles contained in the resin layer 1a may be 0.5 to 3.0 μm or 1.0 to 2.8 μm.

As the binder resin, a thermosetting resin may be used, and for example, an acrylic resin, a urethane resin, and the like may be used. A difference between the refractive index of the binder resin and the refractive index of the photosensitive layer 2 provided to be optically in contact with the resin layer 1a is preferably small from the viewpoint of resolution. Specifically, the absolute value of the difference in refractive index between the resin layer 1a and the photosensitive layer 2 is preferably 0.2 or less, more preferably 0.1 or less, further preferably 0.05 or less, and particularly preferably 0.02 or less.

From the viewpoints of the film strength of the resin layer and prevention of dropping of the inorganic particles, the thickness of the resin layer 1a may be, for example, 0.5 to 8 μm, 1 to 5 μm, or 2.5 to 4.5 μm. In the present specification, the thickness of the resin layer 1a is obtained by subtracting the thickness of the base material layer 1b from the total thickness of the carrier film according to JIS K5600-1-7:2014. The total thickness of the carrier film can be measured by using a micrometer having a flat measurement surface or a dial gauge with a gauge head having a planar measurement surface, and is obtained as a distance between a surface, on which the resin layer 1a is not formed, of the base material layer 1b and a convex top part of the resin layer 1a having unevenness.

The method for producing a carrier film according to the present embodiment is not particularly limited. The carrier film may be produced, for example, by applying a coating liquid containing inorganic particles and a binder resin to a polymer film that becomes the base material layer 1b, and then drying the coating liquid while heating. As the applying method, for example, known methods such as roll coating, comma coating, gravure coating, air knife coating, die coating, and bar coating can be employed. The drying conditions may be, for example, 80° C. to 140° C. for 0.5 to 10 minutes.

The surface roughness of the resin layer 1a that becomes the first surface of the carrier film is 0.1 to 0.4 μm, preferably 0.1 to 0.35 μm, and more preferably 0.1 to 0.3 μm. When the surface roughness of the resin layer 1a exceeds 0.4 μm, the resolution of a resist pattern tends to decrease. When the surface roughness of the resin layer 1a is less than 0.1 μm, the adhesiveness of a permanent mask resist to be formed with respect to an underfill or the like tends to decrease. A second surface that is a surface not in contact with the photosensitive layer of the carrier film is preferably smooth. The surface roughness of the second surface is, for example, less than 0.1 μm. The second surface is a surface at a side, on which the resin layer 1a is not formed, of the base material layer 1b. The surface roughness in the present specification refers to an arithmetical mean roughness (Ra) measured according to JIS B0601:2013.

The haze of the carrier film is 30 to 65% and may be 31 to 64% or 33 to 63%. When the haze of the carrier film exceeds 65%, the resolution of a resist pattern tends to decrease. Furthermore, when the haze of the carrier film is less than 30%, the adhesiveness of a permanent mask resist to be formed with respect to an underfill or the like tends to decrease. The haze can be measured according to JIS K7136:2000.

The total light transmittance (Tt) of the carrier film is preferably 80% or more and more preferably 85% or more, from the viewpoint of energy efficiency at the time of exposure. The total light transmittance can be measured according to JIS K7361-1:1997.

When a resist pattern is formed by using the photosensitive film according to the present embodiment, the photosensitive layer 2 is exposed to active light rays having transmitted the carrier film 1. In general, as the active light rays, ultraviolet rays using, as a light source, a high-pressure mercury lamp, a super high-pressure mercury lamp, or the like are used. These ultraviolet rays are light rays having strong peaks at 365 nm (i rays), 405 nm (h rays), and 436 nm (g rays) that are emission lines of mercury, in terms of characteristics of the light source. A photopolymerization initiator having sensitivity with respect to light beams having these wavelengths is contained in the photosensitive layer. Therefore, practically, the influence of scattering properties with respect to light beams having these wavelengths on the resolution of the photosensitive layer is large.

On the other hand, the haze as measured according to JIS K7136 is a measurement value with respect to a visible light range (380 to 780 nm), and thus it is difficult to say that this haze describes a behavior with respect to light of a specific wavelength to be used in exposure. Therefore, the present inventors have conducted studies specifically on the influence of the spectral haze at a wavelength to be used in exposure on resolution by measuring the light scattering property (haze) at each wavelength to obtain the spectral haze.

The spectral haze at each wavelength can be obtained by the following Equation (1) according to JIS K7136 on the basis of a transmission spectrum (measurement range: 350 to 800 nm) measured by using a spectrophotometer (trade name "Solid Spec 3700" manufactured by SHIMADZU CORPORATION).

$$\text{Haze} = [(\tau_4/\tau_2) - (\tau_3/\tau_1)] \times 100 \quad (1)$$

In the equation, $\tau_1$ represents light flux incident on an integrating sphere in a state of no sample, $\tau_2$ represents light flux transmitting the sample and being incident on the integrating sphere, $\tau_3$ represents diffusion light observed in an integrating sphere in which a trap for excluding parallel light is installed in a state of no sample, and $\tau_4$ represents diffusion light transmitting the sample and observed in the integrating sphere in which a trap for excluding parallel light is installed.

In the photosensitive film 10 according to the present embodiment, since the unevenness of the resin layer 1a of the carrier film 1 is optically in contact with the photosensitive layer 2, the light scattering property (haze) is greatly different from the case of the carrier film 1 alone. Therefore, in order to discuss the resolution of the photosensitive layer 2 in the photosensitive film 10, the haze (spectral haze) in the state of the photosensitive film 10 can be used.

However, in order to improve various properties, the photosensitive layer 2 may contains components (for example, an inorganic filler, a pigment, and the like) affecting optical properties such as light scattering property and light transparency, and thus the spectral haze of the photosensitive film 10 is difficult to be directly measured in some cases. In this regard, in the present specification, the spectral haze is conveniently evaluated by using a laminate film in which a transparent resin layer, which is formed by a resin material not containing a component affecting optical properties, is formed on the first surface of the carrier film. As the resin material, a transparent resin in which a difference between a refractive index of the transparent resin and a refractive index of the photosensitive resin composition forming the photosensitive layer 2 is within ±0.02 can be used. The refractive index in the present specification can be measured by using Abbe's refractometer according to JIS K7142:2014.

A transparent resin layer corresponding to the photosensitive layer 2 is provided on the first surface of the carrier film by using a transparent resin having almost the same refractive index as the refractive index of the photosensitive resin composition forming the photosensitive layer 2, and thereby the spectral haze of the photosensitive film can be evaluated. The transparent resin can be appropriately selected according to the refractive index of the photosensitive resin composition forming the photosensitive layer 2. The thickness of the transparent resin layer is set according to the thickness of the photosensitive layer 2. The total light transmittance of the transparent resin layer according to the present embodiment is preferably 90% or more. When the above-described transparent resin layer is stacked on a film having light transparency like the base material layer 1b, an increase in haze is preferably less than 3%, more preferably less than 2%, and further preferably less than 1%.

From the viewpoint of improving resolution, the spectral haze at a wavelength of 405 nm of the laminate film in which the above-described transparent resin layer is provided on the first surface of the carrier film is 0.1 to 9.0%, preferably 0.1 to 8.5%, and more preferably 0.1 to 8.0%. From the same viewpoint, the spectral haze at a wavelength of 365 nm of the above-described laminate film may be 0.1 to 9.9%, 0.1 to 9.5%, or 0.1 to 9.1%. Further, the spectral haze at a wavelength of 436 nm of the above-described laminate film may be 0.1 to 8.5%, 0.1 to 7.5%, or 0.1 to 6.5%.

(Photosensitive Layer)

The photosensitive layer 2 is a layer which is formed by a photosensitive resin composition. The photosensitive resin composition is not particularly limited as long as it is a material which can be used as a solder resist. The photosensitive resin composition may contain, for example, an acid-modified epoxy resin, a photopolymerizable compound, a photopolymerization initiator, an epoxy resin, and an inorganic filler. Hereinafter, respective components contained in the photosensitive resin composition will be exemplified, but the composition of the photosensitive resin composition is not limited to these components.

The acid-modified epoxy resin may be, for example, a compound obtained by adding polybasic acid anhydride to an esterified produce of an epoxy resin and an ethylenically unsaturated group-containing monocarboxylic acid. Examples of the acid-modified epoxy resin include phenol novolak type acid-modified epoxy acrylates, bisphenol F type acid-modified epoxy acrylates, and urethane-modified bisphenol A type acid-modified epoxy acrylates.

The photopolymerizable compound is not particularly limited as long as it is a compound having a functional group showing photopolymerizability. Examples of the functional group showing photopolymerizability include ethylenically unsaturated groups such as a vinyl group, an allyl group, a propargyl group, a butenyl group, an ethynyl group, a phenylethynyl group, a maleimide group, a nadimide group, and a (meth)acryloyl group. From the viewpoint of reactivity, the photopolymerizable compound preferably contains a compound having a (meth)acryloyl group.

Examples of the photopolymerizable compound having one (meth)acryloyl group include hydroxyalkyl (meth)acrylates such as 2-hydroxyethyl (meth)acrylate and 2-hydroxypropyl (meth)acrylate. Examples of the photopolymerizable compound having two (meth)acryloyl groups include a bisphenol A-based (meth)acrylate compound, dimethylol tricyclodecane di(meth)acrylate, tricyclodecanediol di(meth)acrylate, a compound obtained by reacting a glycidyl group-containing compound with α,β-unsaturated carboxylic acid, and a urethane di(meth)acrylate compound. Examples of the photopolymerizable compound having three or more (meth)acryloyl groups include a compound obtained by reacting a polyhydric alcohol such as trimethylolpropane tri(meth)acrylate, tetramethylolmethane tri (meth)acrylate, tetramethylolmethane tetra(meth)acrylate, dipentaerythritol penta(meth)acrylate, or dipentaerythritol hexa(meth)acrylate with α,β-unsaturated carboxylic acid; and a compound obtained by adding α,β-unsaturated carboxylic acid to a glycidyl group-containing compound such as trimethylolpropane triglycidyl ether triacrylate.

The photopolymerization initiator is not particularly limited as long as it is adjusted to the light wavelength of an exposure machine to be used. Examples of the photopolymerization initiator include an alkylphenone-based photopolymerization initiator, an acylphosphine oxide-based photopolymerization initiator, a compound having a thioxanthone skeleton, and a titanocene-based photopolymerization initiator.

Examples of the epoxy resin include bisphenol A type epoxy resins such as bisphenol A diglycidyl ethers, bisphenol F type epoxy resins such as bisphenol F diglycidyl ethers, bisphenol S type epoxy resins such as bisphenol S diglycidyl ethers, biphenol type epoxy resins such as biphenol diglycidyl ethers, bixylenol type epoxy resins such as bixylenol diglycidyl ethers, hydrogenated bisphenol A type epoxy resins such as hydrogenated bisphenol A glycidyl ethers, phenolbiphenylaralkyl type epoxy resins, and bisphenol novolak type epoxy resins.

Examples of the inorganic filler include silica, zirconia, barium sulfate, barium titanate, talc, clay, fired kaolin, magnesium carbonate, calcium carbonate, calcium sulfate, zinc oxide, magnesium titanate, aluminum oxide, aluminum hydroxide, and mica powder.

The photosensitive resin composition may further contain a curing accelerator (curing catalyst). Examples of the curing accelerator include imidazole compounds such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; and hydrazine compounds such as adipic acid hydrazide and sebacic acid hydrazide.

The photosensitive resin composition may further contain a pigment. As the pigment, a colorant which develops a desired color can be used when concealing the wiring, and the like. Examples of the pigment include known colorants or dyes such as phthalocyanine blue, phthalocyanine green, iodine green, malachite green, diazo yellow, crystal violet, titanium oxide, carbon black, and naphthalene black.

When the photosensitive resin composition is prepared, a solvent for mixing the above-described respective components may be used. Examples of the solvent include alcohols, glycol ethers, ethylene glycol alkyl ether acetates, ketones, esters, and diethylene glycol.

Other components such as a curing accelerator, an ultraviolet absorber, a silane coupling agent, a leveling agent, a plasticizer, an antifoaming agent, a flame retardant, an antioxidizing agent, and a polymerization inhibitor may be added to the photosensitive resin composition as necessary.

The photosensitive layer 2 can be formed by applying a photosensitive resin composition onto the resin layer 1a of the carrier film and drying the photosensitive resin composition. The application can be performed, for example, by a known method using a roll coater, a comma coater, a gravure coater, an air knife coater, a die coater, a bar coater, or the like. Furthermore, the above-described drying can be performed, for example, at 70° C. to 150° C. for about 5 to 30 minutes.

The thickness of the photosensitive layer 2 can be appropriately selected according to use applications. The thickness of the photosensitive layer 2 may be, for example, 5 to 200 μm, 15 to 60 μm, or 20 to 50 μm.

(Protective Film)

The photosensitive film may have a protective film on a surface of the photosensitive layer 2 opposite to the carrier film 1. Examples of the protective film include polyolefin films such as a polyethylene film and a polypropylene film and polyester films such as a polyethylene terephthalate film. The thickness of the protective film is about 1 to 100 μm and may be 5 to 50 μm or 10 to 30 μm.

[Method for Forming Permanent Mask Resist]

A method for forming a permanent mask resist of the present embodiment includes a step of stacking the photosensitive film on a substrate in order of the photosensitive layer and the carrier film, a step of irradiating a predetermined portion of the photosensitive layer with active light rays via the carrier film to form a photocured part in the photosensitive layer, and a step of peeling off the carrier film and then removing a portion other than the photocured part to form a resist pattern. Hereinafter, a method for forming a resist pattern (permanent mask resist) using the photosensitive film of the present embodiment will be described.

Figure 3:
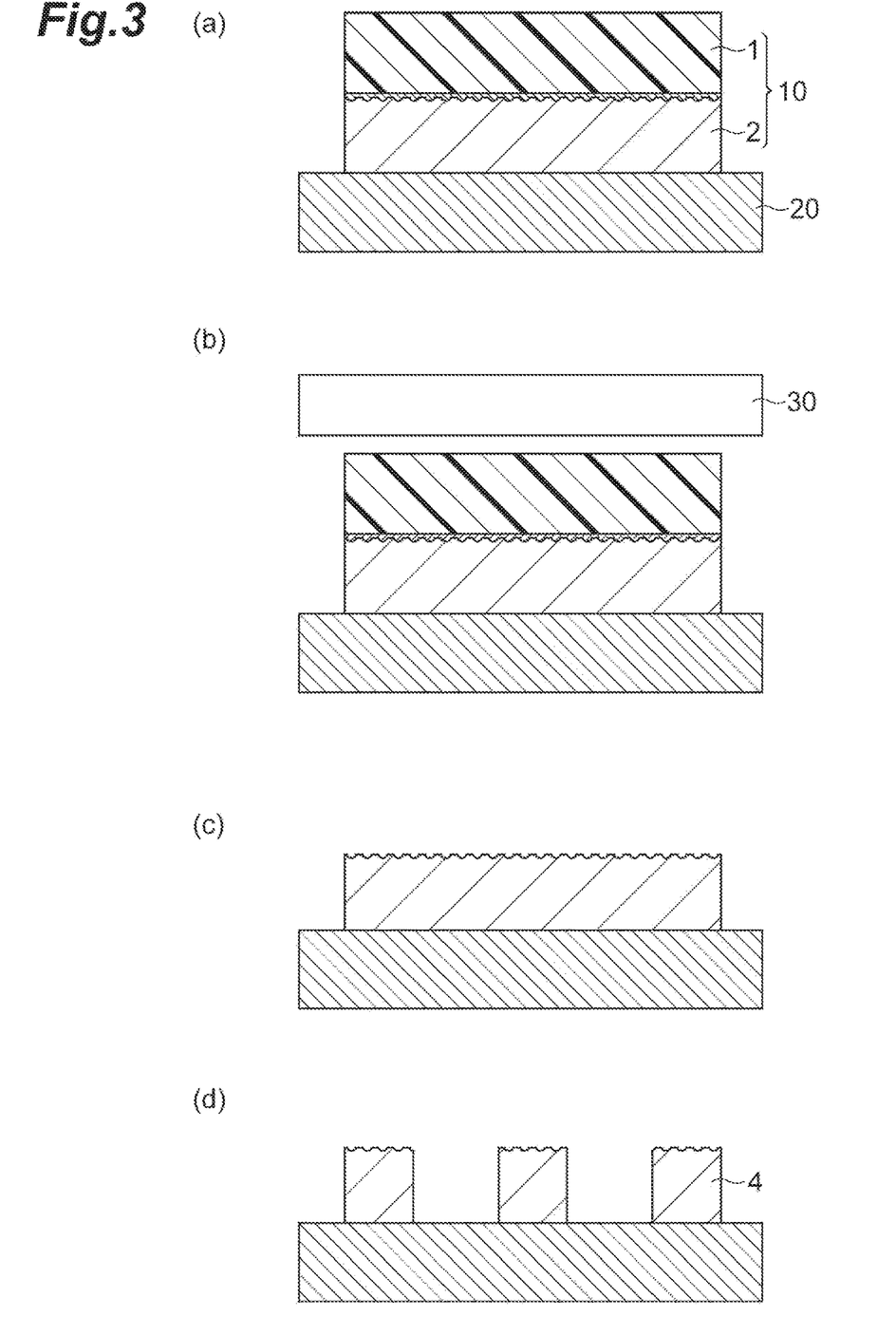
FIG. 3 is a schematic cross-sectional view illustrating a forming process of a permanent mask resist according to the present embodiment.

First, as illustrated in (a) of FIG. 3, the photosensitive layer 2 and the carrier film 1 are stacked on a substrate 20 on which a resist pattern should be formed, by using the photosensitive film 10. Specifically, the photosensitive layer 2 of the photosensitive film 10 described above is adhered by lamination or the like so as to cover a conductor layer having a circuit pattern which has been formed on the substrate 20. From the viewpoint of improving adhesiveness and shape conformity, the photosensitive layer 2 may be formed by a method of laminating under reduced pressure.

Next, as illustrated in (b) of FIG. 3, a photomask 30 having a predetermined pattern is disposed on the carrier film 1, and a photosensitive layer of an irradiated portion is photocured by irradiating a predetermined portion of the photosensitive layer 2 with active light rays through the photomask 30. Known active light sources can be used as a light source of active light rays, and the light source is appropriately selected according to use applications. The irradiance level is appropriately selected according to a light source to be used and the type, thickness, or the like of the photosensitive layer. Incidentally, a method of irradiation of active light rays may be a method not using a mask such as a direct drawing method or a projection exposure method.

After the photocured part is formed in the photosensitive layer, as illustrated in (c) of FIG. 3, the carrier film 1 is peeled off. The surface shape of the resin layer 1a is transferred to a surface, from which the carrier film 1 has been peeled off, of the photosensitive layer 2, and unevenness having a surface roughness of 0.1 to 0.4 μm is formed. Thereafter, a part, which is not photocured, of the photosensitive layer is removed and developed, and thereby a resist pattern 4 illustrated in (d) of FIG. 3 is formed. The surface roughness (Ra) of the resist pattern is 0.1 to 0.4 μm and is more preferably 0.1 to 0.3 μm.

As a developing liquid, a developing liquid that is safe and stable and has good operability, such as an alkaline aqueous solution, a water-based developing liquid, or an organic solvent, is used according to the type of the photosensitive resin composition. Of them, from the viewpoints of environment and safety, an alkaline aqueous solution is preferred. As a developing method, known methods such as spraying, showering, reciprocal dipping, brushing, and scrapping are appropriately employed.

After a developing step is ended, for the purpose of improving solder dip resistance, chemical resistance, and the like, the resist pattern may be subjected to ultraviolet ray irradiation or heating. In the case of irradiation of ultraviolet rays, the irradiance level thereof can be adjusted as necessary, and for example, the ultraviolet rays may be applied at an irradiance level of about 0.05 to 10 J/cm$^2$. Furthermore, in the case of heating the resist pattern, for example, the heating may be performed at a range of about 130° C. to 200° C. for 15 to 90 minutes.

Both the ultraviolet ray irradiation and the heating may be performed. In this case, the ultraviolet ray irradiation and the heating may be performed at the same time, or any one thereof may be performed and then the other may be performed. In the case of performing the ultraviolet ray irradiation and the heating at the same time, the heating may be performed at 60° C. to 150° C. from the viewpoint of more favorably imparting solder dip resistance and chemical resistance.

The resist pattern formed in this way also works as a protection film for a wiring after soldering on the substrate, has various properties of a solder resist, and can be used as a solder resist for a printed wiring board, a semiconductor package substrate, or a flexible wiring board. The above-described solder resist is used, for example, as a plating resist or etching resist in a case where plating or etching is carried out to the substrate, and besides, is left as it is on the substrate, and is used as a protection film (permanent mask resist) for protecting wiring or the like.

Other members such as a sealing material, an underfill material, and a conductor can be formed on the substrate on which the permanent mask resist is formed. The adhesiveness of the permanent mask resist according to the present embodiment with various members can be improved by an anchor effect based on the above-described surface roughness.

EXAMPLES

Hereinafter, the present invention will be described in more detail by means of Examples; however, the present invention is not limited to these Examples.

[Production of Carrier Film]

Experimental Example 1

0.9 parts by mass of silica particles having an average particle diameter of 4.5 μm, 6.0 parts by mass of a thermosetting acrylic resin (solid content: 50% by mass), 20.1 parts by mass of a solvent, and 1.5 parts by mass of a curing agent (solid content: 60% by mass) were mixed with a bead mill to prepare a coating liquid. The coating liquid was applied to a polyethylene terephthalate (PET) film having a thickness of 25 μm and then cured by heating at 110° C., and thereby a carrier film on which a resin layer having a thickness of 4 μm was formed was obtained. The average particle diameter of the silica particles dispersed in the coating liquid was 2.7 μm.

Experimental Example 2

A carrier film was obtained in the same manner as in Experimental Example 1, except that a coating liquid was prepared by setting the mixing time with a bead mill to be twice the mixing time in Experimental Example 1, The average particle diameter of the silica 2.5 particles dispersed in the coating liquid was 1.2 μm.

Experimental Example 3

1.0 part by mass of silica particles having an average particle diameter of 4.5 μm, 1.0 part by mass of silica particles having a primary particle diameter of 16 nm, 86.1 parts by mass of a thermosetting acrylic resin (solid content: 50% by mass), 206 parts by mass of a solvent, and 34.4 parts by mass of a curing agent (solid content: 60% by mass) were mixed with a bead mill to prepare a coating liquid. The coating liquid was applied to a PET film having a thickness of 50 μm and then heated at 110° C., and thereby a carrier film on which a resin layer having a thickness of 2 μm was formed was obtained. The average particle diameter of the silica particles dispersed in the coating liquid was 2.5 μm.

Experimental Example 4

A carrier film was obtained in the same manner as in Experimental Example 1, except that a coating liquid was prepared by setting the mixing time with a bead mill to be four times the mixing time in Experimental Example 1. The average particle diameter of the silica particles dispersed in the coating liquid was 0.8 μm.

Experimental Example 5

A film having unevenness on a surface (trade name "LIGHT-UP UK2" manufactured by KIMOTO Co., Ltd.) was used as the carrier film.

[Evaluation of Carrier Film]

The surface roughness (Ra), the total light transmittance (Tt), the haze (Hz), and the spectral haze at each wavelength (Hz(wavelength)) of the surface (first surface), on which the resin layer was formed, of the carrier film were measured, respectively. The results are shown in Table 1.

TABLE 1

|  | Ra (μm) | Tt (%) | Hz (%) | Hz(365) (%) | Hz(405) (%) | Hz(436) (%) |
|---|---|---|---|---|---|---|
| Experimental Example 1 | 0.21 | 89.9 | 60.9 | 71.5 | 69.8 | 68.0 |
| Experimental Example 2 | 0.12 | 89.0 | 35.0 | 52.4 | 49.4 | 47.0 |
| Experimental Example 3 | 0.20 | 88.3 | 30.9 | 47.0 | 43.8 | 41.6 |
| Experimental Example 4 | 0.06 | 88.9 | 13.0 | 27.0 | 24.5 | 22.6 |
| Experimental Example 5 | 0.66 | 88.2 | 35.6 | 54.5 | 54.2 | 53.5 |

A laminate film on which a transparent resin layer having a thickness of 25 μm was provided was produced on the first surface of the carrier film by using a transparent resin having a refractive index ($n_D$) of 1.56 (a resin obtained by mixing, at a solid content ratio of 1:1, trade name "ACRYDIC A807" ($n_D$: 1.54) manufactured by DIC Corporation and trade name "TAKENATE D-110N" ($n_D$: 1.58) manufactured by Mitsui Chemicals, Inc.). The total light transmittance (Tt), the haze (Hz), and the spectral haze at each wavelength of the laminate film were measured. The results are shown in Table 2.

TABLE 2

|  | Tt (%) | Hz (%) | Hz(365) (%) | Hz(405) (%) | Hz(436) (%) |
|---|---|---|---|---|---|
| Experimental Example 1 | 88.8 | 3.4 | 9.1 | 7.5 | 6.5 |
| Experimental Example 2 | 88.8 | 2.8 | 7.7 | 6.4 | 5.7 |
| Experimental Example 3 | 87.4 | 8.1 | 17.1 | 14.1 | 12.4 |
| Experimental Example 4 | 88.8 | 9.9 | 7.2 | 6.1 | 5.5 |
| Experimental Example 5 | 90.7 | 4.8 | 10.0 | 9.3 | 8.6 |

[Production of Photosensitive Film]

Example 1

A photosensitive resin composition having a refractive index ($n_D$) of 1.56 (trade name "SR7200G" manufactured by Hitachi Chemical Company, Ltd.) was applied onto the first surface of the carrier film of Experimental Example 1 and dried at 75° C. for 30 minutes to form a photosensitive layer having a thickness of 25 μm, and thereby a photosensitive film was produced.

Example 2

A photosensitive film was produced in the same manner as in Example 1, except that the carrier film of Experimental Example 2 was used.

Comparative Example 1

A photosensitive film was produced in the same manner as in Example 1, except that the carrier film of Experimental Example 3 was used.

Comparative Example 2

A photosensitive film was produced in the same manner as in Example 1, except that the carrier film of Experimental Example 4 was used.

Comparative Example 3

A photosensitive film was produced in the same manner as in Example 1, except that the carrier film of Experimental Example 5 was used.

[Evaluation of Photosensitive Film]

The resolution and the adhesiveness of the photosensitive film were evaluated under the following conditions. The results are shown in Table 3.

(Resolution)

A laminate for evaluation in which a photosensitive layer of a photosensitive film was stacked on a substrate so as to be in contact with the substrate under conditions of a pressing heat plate temperature of 70° C., a vacuuming time of 20 seconds, a laminate pressing time of 30 seconds, and a pressure of 0.4 MPa was obtained. Next, a mask having a 70 μm circular pattern was disposed on the carrier film, and the mask was irradiated with active light rays at an exposure dose of 300 mJ/cm$^2$ from a parallel exposure apparatus having a super high-pressure mercury lamp as a light source (trade name "PA-1600H-150STP" manufactured by SEIWA OPTICAL CO., LTD.). After irradiation, the carrier film was peeled off and spray-developed for 60 seconds at a spray pressure of 0.1 MPa by using a 1% by mass aqueous solution of sodium carbonate at 30° C. as a developing liquid, thereby forming a resist pattern. The via opening size of the resist pattern was measured with a microscope to evaluate resolution.

(Adhesiveness)

After the whole surface of the laminate for evaluation was irradiated with active light rays under the same conditions as described above without providing a pattern mask, the carrier film was peeled off, the heating treatment was performed at 160° C. for 60 minutes, and thereby a cured film serving as a permanent mask resist was produced. Next, an underfill material (trade name "CEL-C-3730S" manufactured by Hitachi Chemical Company, Ltd.) was applied onto the cured film and cured at 170° C. for 2 hours. The die shear strength of the cured film and the underfill material at room temperature (25° C.) was measured by using trade name "BT100" manufactured by Nordson DAGE.

TABLE 3

|  | Example 1 | Example 2 | Comparative Example 1 | Comparative Example 2 | Comparative Example 3 |
|---|---|---|---|---|---|
| Opening size (μm) | 66 | 66 | 53 | 66 | 58 |
| Opening size/ pattern diameter | 0.94 | 0.94 | 0.76 | 0.94 | 0.83 |
| Adhesive strength (MPa) | 22.0 | 19.2 | 19.6 | 16.0 | 27.9 |

From Tables 1 to 3, it was confirmed that the photosensitive film of the present invention is provided with a carrier film having a specific surface roughness and a specific spectral haze, and thereby a resist pattern excellent in resolution and adhesiveness can be easily formed.

REFERENCE SIGNS LIST

1: carrier film, 1b: base material layer, 1a: resin layer, 2: photosensitive layer, 4: resist pattern, 10: photosensitive film, 20: substrate, 30: photomask.

The invention claimed is:
1. A photosensitive film comprising:
a carrier film having a first surface whose surface roughness is 0.1 to 0.4 μm; and
a photosensitive layer formed on the first surface, wherein a haze of the carrier film is 30 to 65%, and a spectral haze at a wavelength of 405 nm of the carrier film, as measured by providing a transparent resin layer in which a difference between a refractive index of the transparent resin layer and a refractive index of the photosensitive layer is within ±0.02 on the first surface, is 0.1 to 9.0%, and the carrier film includes a base material layer, and a resin layer containing inorganic particles and a binder resin at a side of the first surface.

2. The photosensitive film according to claim 1, wherein the resin layer contains inorganic particles having an average particle diameter of 0.1 to 3.0 μm.

3. The photosensitive film according to claim 1, wherein a thickness of the resin layer is 0.5 to 8 μm.

4. A method for forming a permanent mask resist, the method comprising:
- a step of stacking the photosensitive film according to claim 1 on a substrate in order of the photosensitive layer and the carrier film;
- a step of irradiating a predetermined portion of the photosensitive layer with active light rays via the carrier film to form a photocured part in the photosensitive layer; and
- a step of peeling off the carrier film and then removing a portion other than the photocured part to form a resist pattern, wherein a surface roughness of the resist pattern is 0.1 to 0.4 μm, and the carrier film includes a base material layer, and a resin layer containing inorganic particles and a binder resin at a side of the first surface.

5. The photosensitive film according to claim 2, wherein a thickness of the resin layer is 0.5 to 8 μm.

6. The method for forming a permanent mask resist according to claim 4,
wherein the resin layer contains inorganic particles having an average particle diameter of 0.1 to 3.0 μm.

7. The method for forming a permanent mask resist according to claim 4,
wherein a thickness of the resin layer is 0.5 to 8 μm.

8. The method for forming a permanent mask resist according to claim 6,
wherein a thickness of the resin layer is 0.5 to 8 μm.

* * * * *